(12) United States Patent
Palmer et al.

(10) Patent No.: US 11,868,632 B2
(45) Date of Patent: Jan. 9, 2024

(54) POWER CONTROL FOR BOOT-UP OF MEMORY SYSTEMS

(71) Applicant: Micron Technology, Inc., Boise, ID (US)

(72) Inventors: David Aaron Palmer, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 17/736,605

(22) Filed: May 4, 2022

(65) Prior Publication Data

US 2023/0214137 A1 Jul. 6, 2023

Related U.S. Application Data

(60) Provisional application No. 63/295,059, filed on Dec. 30, 2021.

(51) Int. Cl.
*G06F 12/00* (2006.01)
*G06F 3/06* (2006.01)

(52) U.S. Cl.
CPC .......... *G06F 3/0632* (2013.01); *G06F 3/0625* (2013.01); *G06F 3/0679* (2013.01)

(58) Field of Classification Search
CPC .... G06F 3/0632; G06F 3/0625; G06F 3/0679; G06F 12/0238; G06F 2211/1097; G06F 9/4401
See application file for complete search history.

(56) References Cited

U.S. PATENT DOCUMENTS

| 7,072,989 B1* | 7/2006 | Kolokowsky | ......... G06F 1/3203 710/14 |
| 2013/0042129 A1* | 2/2013 | Park | ...................... G06F 1/3275 713/323 |
| 2022/0206821 A1* | 6/2022 | Devegowda | ........ G06F 13/4221 |

* cited by examiner

*Primary Examiner* — Shawn X Gu
(74) *Attorney, Agent, or Firm* — Holland & Hart LLP

(57) ABSTRACT

Methods, systems, and devices for power control for boot-up of memory systems are described. A memory system may be configured to boot-up using two different power modes: a lower-power mode, and a higher-power mode. The memory system may perform a series of evaluations to determine whether the memory system is to switch to the lower-power mode during boot-up operations, or stay in the higher-power mode. For example, the memory system may check one or more of: a history of previous boot-up failures, a voltage of an associated power management integrated circuit, a history of asynchronous power loss at the device, a power-mode configuration of the host device, or a history of host-initiated power-down commands. In some examples, by switching to the lower-power mode, the memory system may avoid repeatedly failing multiple boot-up cycles and may instead successfully boot-up the memory system.

25 Claims, 5 Drawing Sheets

POWER CONTROL FOR BOOT-UP OF MEMORY SYSTEMS

CROSS REFERENCE

The present Application for Patent claims the benefit of U.S. Provisional Patent Application No. 63/295,059 by PALMER et al., entitled "POWER CONTROL FOR BOOT-UP OF MEMORY SYSTEMS," filed Dec. 30, 2021, assigned to the assignee hereof, and expressly incorporated by reference herein.

FIELD OF TECHNOLOGY

The following relates generally to one or more systems for memory and more specifically to power control for boot-up of memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Many battery-powered devices (e.g., cell phones, laptops) may include one or more memory systems to store information at the device. Frequently, a battery of the battery-powered device may not be fully charged (e.g., if the battery level is below a threshold) when the device is powered on by a user. In such cases, the battery-powered device may initiate a boot-up operation at the one or more memory systems. However, the lower-power state of the device may impede the boot-up operation at a memory system. For example, in some cases, the current provided by the battery of the battery-powered device may not be sufficient to perform the boot-up operation at the memory system. In such examples, the memory system may attempt to perform the boot-up operation, but may crash due to lack of current. In some examples, the memory system may repeat the attempt to perform the boot-up operation, but may crash repeatedly, thus entering a boot-up failure loop.

Accordingly, the techniques as described herein provide power control for boot-up of memory systems. For example, a memory system may be configured to boot-up using two different power modes: a lower-power mode, and a higher-power mode. In some cases, the memory system may default to using the higher-power mode during boot-up operations. For example, the higher-power mode may be lower latency or more efficient if the battery of the battery-powered device (e.g., a host device) is sufficiently charged. In some cases, the memory system may perform a series of checks to determine whether the memory system is to switch to the lower-power mode during boot-up operations. For example, the memory system may check one or more of: a history of previous boot-up failures, a voltage of an associated power management integrated circuit (PMIC), a history of asynchronous power loss at the device, a power-mode configuration of the host device, or a history of host-initiated power-down commands. In some cases, the memory system may determine to switch to the lower-power mode during boot-up operations after performing any of the checks as described herein. In some examples, by switching to the lower-power mode, the memory system may avoid entering the boot-up failure cycle and may instead successfully boot-up the memory system.

Figure 1:
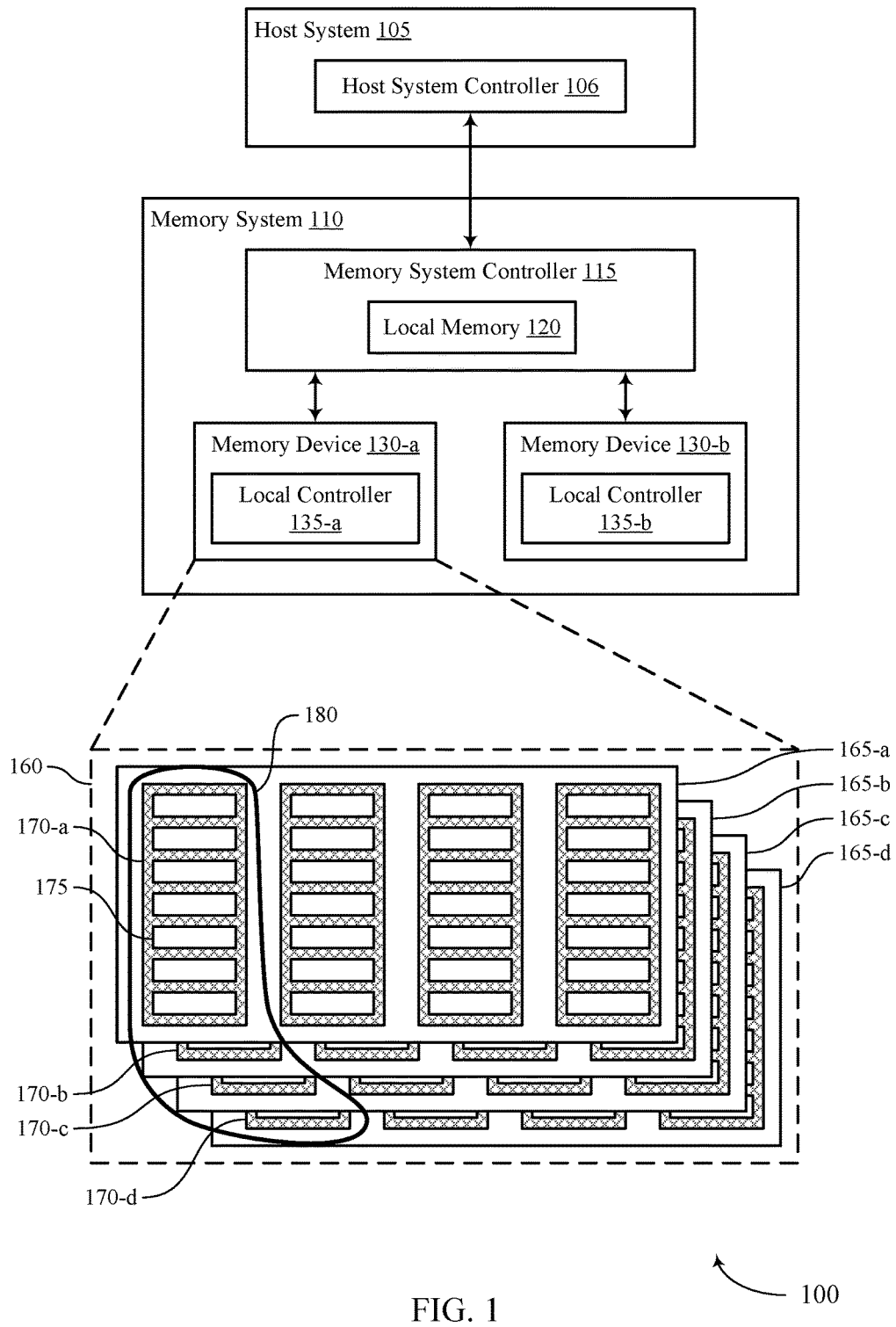
FIG. 1 illustrates an example of a system that supports power control for boot-up of memory systems in accordance with examples as disclosed herein.

Features of the disclosure are initially described in the context of systems, devices, and circuits with reference to FIG. 1. Features of the disclosure are described in the context of battery-powered devices and process flows with reference to FIGS. 2-3. These and other features of the disclosure are further illustrated by and described in the context of an apparatus diagram and a flowchart that relate to power control for boot-up of memory systems with reference to FIGS. 4-5.

FIG. 1 illustrates an example of a system 100 that supports power control for boot-up of memory systems in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB)

flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support power control for boot-up of memory systems. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, the system 100 may be an example of a battery-powered device, such as a phone, laptop, tablet, or other device. Such a battery-powered device may operate and power-on when the battery is at different levels of charge, and may be powered-down and powered-on by a user. In some cases, a user may power-on the system 100 while its battery is below a threshold amount of charge. In some cases, one or more host systems 105 at the system 100 may perform boot-up operations, which may include sending commands to associated memory systems 110 to perform boot-up operations. In some cases, a memory system 110 may fail to boot-up due to a lack of sufficient current to perform the boot-up procedure. In some cases, upon a failed boot-up at the memory system 110, the host system controller 106 may resend the boot-up command to the memory system 110, thus commanding the memory system 110 to try booting-up again. If the low-charge condition persists, the second boot-up procedure may fail as well. After the next failure, the host system 105 may again send a boot-up command, and the system 100 may enter a boot-up failure loop for the memory system 110.

To avoid the boot-up failure loop and successfully boot-up the memory system 110 while operating with a low battery, the memory system 110 may perform a series of evaluations to determine if it is to initialize the boot-up in a lower-power mode. For example, the memory system 110 may be configured to operate in either a lower-power mode or a higher-power mode. By determining on a case-by-case basis which mode to use for the boot-up, the memory system 110 may boot-up more efficiently and without a risk of repeated failure due to low battery.

Figure 2:
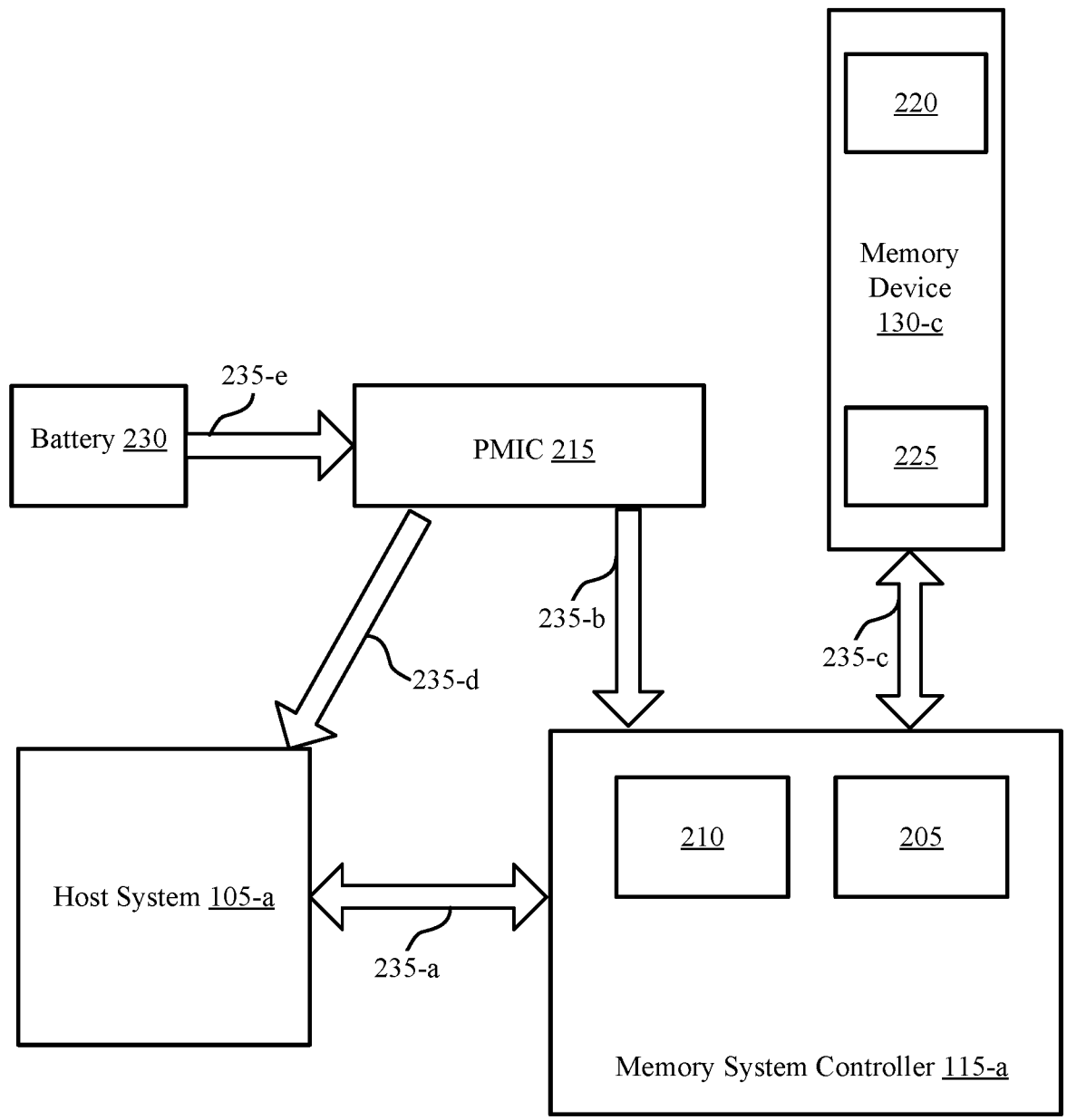
FIG. 2 illustrates an example of a battery-powered device that supports power control for boot-up of memory systems in accordance with examples as disclosed herein.

FIG. 2 illustrates an example of a battery-powered device 200 that supports power control for boot-up of memory systems in accordance with examples as disclosed herein. The battery-powered device 200 may be an example of aspects of a memory system as described with reference to FIG. 1. For example, the battery-powered device 200 may include a host system 105-a, a memory system controller 115-a, and a memory device 130-c as described with reference to FIG. 1. The battery-powered device 200 may also include a battery 230 and a PMIC 215. The memory system controller 115-a may include a voltage detector 210 and a boot-up determination component 205. The memory device 130-c may include a shutdown evaluation component 220 and a power mode flag 225. The components of the battery-powered device 200 may be coupled by the connections 235, (e.g., the connection 235-a, connection 235-b, connection 235-c, connection 235-d, and connection 235-e), which may be examples of electrical connections, physical connections, or wireless communications links.

In some examples, the battery-powered device 200 may be an example of a phone, a laptop, or another type of device that may be powered by a battery and may be powered-on by a user. If a user-initiated power-on occurs, a boot-up procedure for the battery-powered device 200 and/or the host system 105-a may be initialized. As part of the boot-up procedure for the host system 105-a, the host system 105-a may send a command to the memory system controller 115-a to initiate a boot-up of the memory system 115-a. For example, the host system 105-a may send the command as part of its own boot-up operation, and may not complete the boot-up at the host system 105-a until the boot-up at the memory system controller 115-a is complete. The host system 105-a may also send commands to boot-up other sub-systems as part of its boot-up operation. In some cases, the battery-powered device 200 may have a low charge at the battery 230. In such cases, the battery 230 may not provide sufficient current to the PMIC 215 (e.g., through connection 235-e) to support the boot-up at the memory system controller 115-a. The memory system controller 115-a may crash while attempting to perform the boot-up operation, which may also impede the boot-up operation at the host system 105-a. In some cases, after a failed boot-up at the memory system controller 115-a, the host system 105-a may restart the process and repeat the command to initiate the boot-up of the memory system controller 115-a. If the lower-power condition persists, the host system 105-a and the memory system controller 115-a may enter into a repetitive loop of failed boot-ups by the memory system 115-a and then the host system 105-a immediately sending another boot-up command. Thus, the low current at the PMIC 215 may prevent a successful boot-up at the memory system controller 115-a.

To successfully boot-up both the memory system and host system 105-a at the battery-powered device 200, the memory system controller 115-a may be configured to initiate the boot-up operation using either a lower-power mode or a higher-power mode. In some cases, the memory system controller 115-a may determine, based on one or more parameters, whether to use the lower-power or higher-power mode. For example, the memory system controller 115-a may determine to switch to a lower-power mode based on checking a parameter associated with a previous boot-up of the memory system. The lower-power mode may reduce a peak current used during the boot-up operation (as compared with the higher-power mode), which may increase a likelihood that the boot-up operation may be successful in a lower-current condition. The lower-power mode may, however, take a longer duration of time to perform the boot-up operation (as compared with the higher-power mode). Thus, in a regular power condition, the memory system 115-a may perform boot-up operations in the higher-power mode to improve the performance (e.g., lower latency) of the boot-up operation.

The memory system controller 115-a may include a voltage detector 210, which may be an example of an ASIC or other circuitry as described with reference to FIG. 1. For example, the voltage detector 210 may be configured to determine the state of the PMIC 215 (e.g., a voltage level of the voltage supplied to the memory system 115-a by the PMIC 215). In some cases, the connection 235-d may be an electrical connection coupling the PMIC 215 with the host system 105-a. In some cases, the connection 235-b may be an electrical connection coupling the PMIC 215 with the voltage detector 210. In some cases, if the voltage detector 210 detects a low voltage supplied by the PMIC 215, it may trigger a switch to a lower-power initialization mode at the memory system controller 115-a. The voltage detector 210 may include one or more internal state registers, which may maintain their values if the memory system is reset. For example, if the battery-powered device 200 is powered down, a register at the voltage detector 210 may have a value that persists across the controller reset. For example, the register at the voltage detector 210 may be an example of a "sticky" register that may not reset its value if the voltage detector 210 or the memory system controller 115-a is reset. In some cases, the value at the sticky register may provide some insight into the cause of a system reset. However, a full power-down of the memory system controller 115-a may cause the sticky register to lose its value. In some cases, if the memory device 130-c loses power while the memory controller 115-a retains power, a record of the power loss event may be kept at the sticky register of the voltage detector 210. On a subsequent boot-up operation, the memory system controller 115-a may determine the cause of the previous power-down by checking the information at the voltage detector 210. In some cases, a memory device 130-c may store and query information from one or more sticky registers to record information that may span one or more power-down events of the memory device 130-c.

The memory system controller 115-a may have a boot-up determination component 205, which may be an example of circuitry as described with reference to FIG. 1. The boot-up determination component 205 may receive inputs from other components of the memory system controller 115-a or the battery-powered device 200, or may check a status of the other components. For example, the boot-up determination component 205 may receive information from the PMIC 215 via the connection 235-b, or from the memory device 130-c via the connection 235-c. In some cases, the boot-up determination component 205 may receive information from components within the memory system controller 115-a, such as the voltage detector 210, via internal connections. The boot-up determination component 205 may use the received information to determine whether the memory system controller 115-a may initiate a boot-up in the lower-power mode or in the higher-power mode.

The memory system controller may be coupled with one or more memory devices 130, as described with reference to FIG. 1, such as the memory device 130-c. In some cases, the memory device 130-c may be an example of a non-volatile memory device, such as a not-and (NAND) memory device. The memory device 130-c may include one or more components that may transmit information to the boot-up determination component 205 via the connection 235-c. For example, the shutdown evaluation component 220 may be an example of circuitry configured to determine whether a previous shutdown of the memory system was initiated by the battery-powered device 200. The shutdown evaluation component 220 may also be configured to determine whether a previous shutdown occurred due to asynchronous power loss. For example, if a previous shutdown of the memory system 115-a was not initiated by the host system 105-a or the battery-powered device 200, that may indicate that the previous shutdown was an asynchronous power loss. In the case that the shutdown evaluation component 220 may detect an anomalous characteristic of a previous shutdown, the shutdown evaluation component 220 may transmit an indication to the boot-up determination component 205. In another example, the power mode flag 225 may be an example of stored information at the memory device 130-a indicating whether a component of the battery-powered device 200 may be configured to operate in a specific power mode. For example, the power mode flag 225 may be a bInitPowerMode parameter that may indicate that the host system 105-a may be configured to operate in the lower-power mode. In some cases, the memory device 130-c may communicate to the boot-up determination component 205 the information stored at the power mode flag 225.

Figure 3:
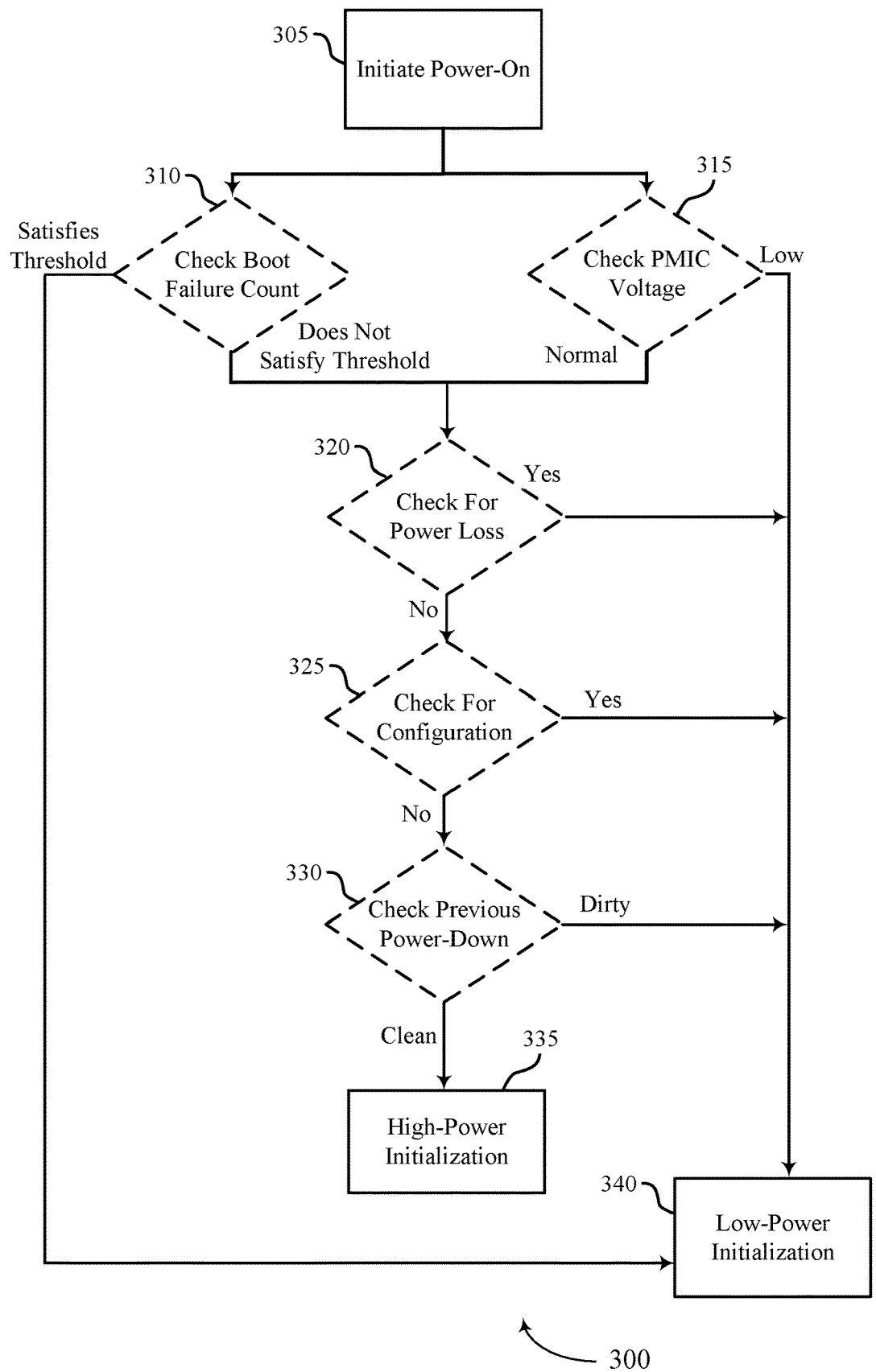
FIG. 3 illustrates an example of a process flow that supports power control for boot-up of memory systems in accordance with examples as disclosed herein.

FIG. 3 illustrates an example of a process flow 300 that supports power control for boot-up of memory systems in accordance with examples as disclosed herein. Process flow 300 may be implemented by a memory system, which may represent a memory system described with respect to FIGS. 1 and 2. Process flow 300 may be implemented by the memory system, for example, to initiate a boot-up operation at the memory system and determine whether to boot-up in a lower-power mode or a higher-power mode. Alternative examples of the following may be implemented, where some steps are performed in a different order or not at all. Additionally or alternatively, some steps may include additional features not mentioned below, some steps may be performed by different components or systems, or any combination thereof.

Aspects of the process flow 300 may be implemented by a memory system, a memory device, or a controller, among other components. Additionally or alternatively, aspects of the process flow 300 may be implemented as instructions in stored memory (e.g., firmware stored in a memory coupled with the memory system). For example, the instructions, if executed by a controller (e.g., the memory system controller 115) may cause the controller to perform the operations of the process flow 300.

At 305, a power-on may be initiated (e.g., by the memory system), which may include initiating a boot-up sequence. In some cases, the memory system may initiate the power-on in response to a command from a host system. In some cases, the memory system may initiate the power-on in response to a user-initiated power-on. In some cases, whether the memory system may successfully boot-up in a lower-power mode or higher-power mode may be impacted by one or more states of components of the memory system and host system, as described with reference to FIG. 2. Once the memory system has initiated the power-on, the memory system may proceed to make a series of one or more evaluations to determine which power mode to use during the boot-up.

The memory system may evaluate one or more parameters to determine whether to perform a boot-up operation in a lower-power mode. The parameters are described below in a particular order. However, the parameters may be evaluated in any order or any combination.

In some examples, at 310, it may be determined whether a count of previous boot-operation failures satisfies a threshold (e.g., by a memory system). For example, each time a boot-up operation fails, the memory system controller may increment a counter. The counter may be stored at a register (e.g., in SRAM), and the stored value may persist across successive boot-up operations. In some cases, if the value of the counter does not satisfy a threshold, the memory system may proceed to 320. In some cases, if the value of the counter satisfies the threshold, the memory system may proceed to 340 and may determine to initialize the boot-up operation in the lower-power mode. In some cases, the threshold may be a value selected to prevent the memory system from entering a repetitive loop of boot-up failures or to mitigate a quantity of boot-up failures attempted in the higher-power mode before moving to the lower-power mode.

In some examples, at 315, it may be determined if a voltage level at the PMIC was low during a previous boot-up operation (e.g., by a memory system). For example, in some cases, the memory system may detect a low voltage supplied by the PMIC to the memory system (e.g., by the voltage detector), and may store an indication at the voltage detection component (e.g., in SRAM). In some cases, the low voltage supplied by the PMIC may cause a boot-up failure. In some cases, the low voltage may not cause a complete failure, but may cause some errors during the boot-up (e.g., a "brownout"). In such cases, the memory system may detect the previous low voltage and may proceed to 340 to initialize the boot-up operation in the lower-power mode. By switching to the lower-power mode, the memory system may avoid errors in subsequent boot-up operations due to low voltage at the PMIC. In some cases, the memory system may detect that a previous boot-up of the memory system had a normal voltage. In such cases, the memory system may proceed to 320. In some cases, the memory system may perform either step 310 or step 315.

In some examples, at 320, it may be determined whether an asynchronous power loss event occurred prior to the boot-up operation (e.g., by a memory system). For example, in some cases, an asynchronous power loss may occur due to a power outage, an improper shutdown of the device, or another reason. In some cases, if an asynchronous power loss has occurred previously, the memory system may proceed to 340 to initialize the boot-up operation in the lower-power mode. In some cases, if no asynchronous power loss is detected, the memory system may proceed to 325.

In some examples, at 325, it may be determined whether the host system is configured to operate in a lower-power mode or a higher-power mode (e.g., by a memory system). For example, in some cases, the memory system may receive, from a host system, a command to perform the boot-up in the lower-power mode. In such cases, the memory system may proceed to 340 to initialize the boot-up operation in the lower-power mode. In some cases, a non-volatile memory device at the memory system (e.g., NAND) may store a flag received from the host system indicating which power mode the host system is configured for. In some cases, the flag may be an example of a bInitPowerMode parameter, as described with reference to FIG. 2. In some cases, if the memory system detects the flag, the memory system may proceed to 340 to initialize the boot-up operation in the lower-power mode. In some cases, the memory system may determine either that the host system is configured for the higher-power mode, or that there is no mode-specific configuration, and may proceed to 330.

In some examples, at 330, it may be determined whether a previous power-down operation was initiated by the host system (e.g., by a memory system). For example, a host-initiated power-down may also be referred to as a "clean" power-down, and a non-host-initiated power-down may also be referred to as a "dirty" power-down. In some cases, information regarding the previous power-down may be stored in non-volatile memory (e.g., NAND) at the memory system, as described with reference to FIG. 2. In some cases, if the memory system determines, after checking the information stored in NAND, that the previous power-down was dirty, the memory system may proceed to 340 to initialize the boot-up operation in the lower-power mode. In some cases, if the memory system determines that the previous power-down was clean, the memory system may proceed to 335.

At 335, the boot-up operation may be initialized in the higher-power mode (e.g., by a memory system). At this step, the memory system may have completed the set of evaluations to determine which power mode to use for the boot-up operation, and determined that there was no event or parameter to trigger switching to a lower-power mode.

In some cases, the memory system may perform the steps 305 through 340 at the start of each boot-up operation of the memory system. By performing the steps 305 through 340, the memory may efficiently perform the boot-up and avoid performing repetitive failed boots due to insufficient power or other issues at the memory system or host system.

Figure 4:
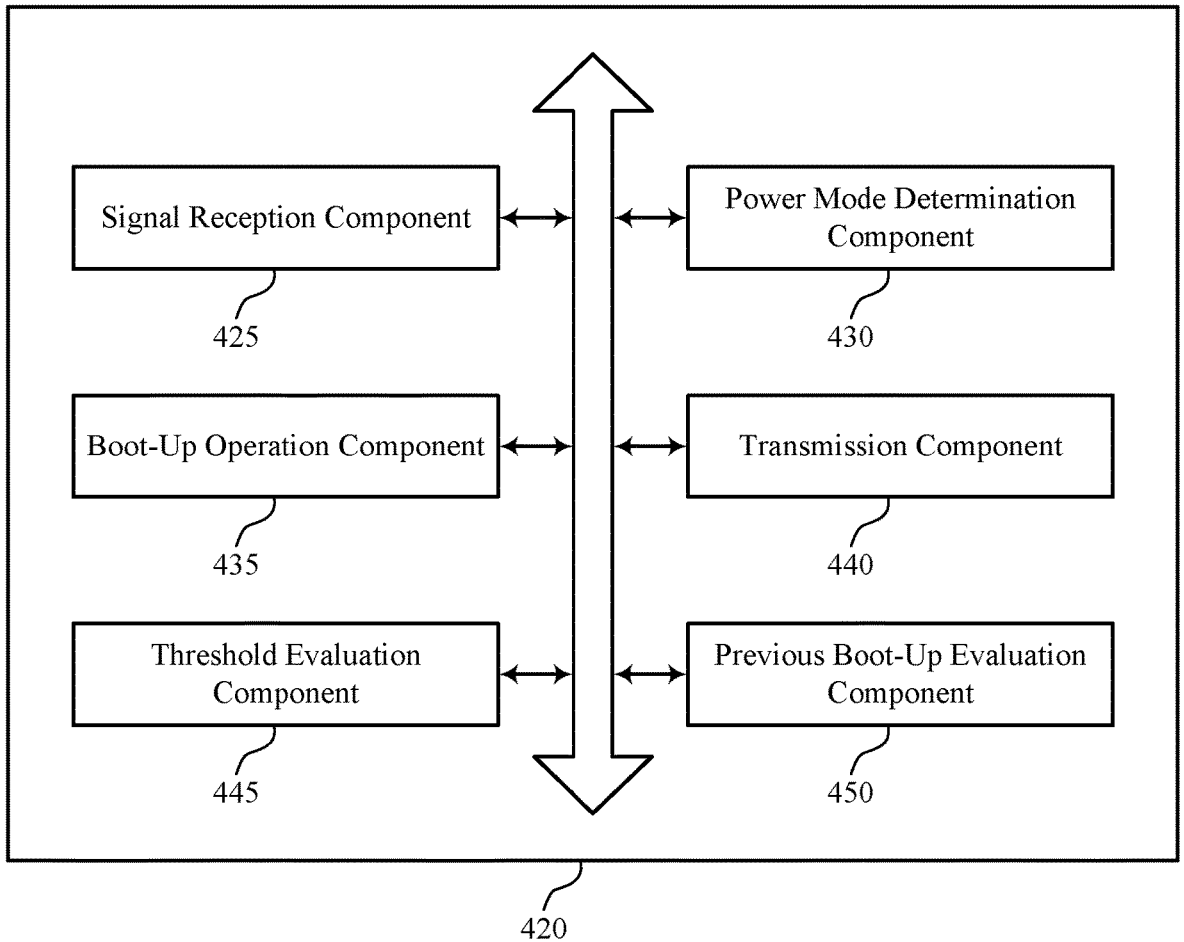
FIG. 4 shows a block diagram of a memory system that supports power control for boot-up of memory systems in accordance with examples as disclosed herein.

FIG. 4 shows a block diagram 400 of a memory system 420 that supports power control for boot-up of memory systems in accordance with examples as disclosed herein. The memory system 420 may be an example of aspects of a memory system as described with reference to FIGS. 1 through 3. The memory system 420, or various components thereof, may be an example of means for performing various aspects of power control for boot-up of memory systems as described herein. For example, the memory system 420 may include a signal reception component 425, a power mode determination component 430, a boot-up operation component 435, a transmission component 440, a threshold evaluation component 445, a previous boot-up evaluation component 450, or any combination thereof. Each of these components may communicate, directly or indirectly, with one another (e.g., via one or more buses).

The signal reception component 425 may be configured as or otherwise support a means for receiving, at a memory system, a signal from a host system to power-on the memory system. The power mode determination component 430 may be configured as or otherwise support a means for determining whether to boot-up the memory system in a first power mode or a second power mode based at least in part on one or more characteristics of a previous boot-up operation of the memory system, the first power mode configured to use more current than the second power mode. The boot-up operation component 435 may be configured as or otherwise support a means for performing a boot-up operation in the first power mode or in the second power mode based at least in part on determining whether to boot-up the memory system in the first power mode or the second power mode.

In some examples, the transmission component 440 may be configured as or otherwise support a means for transmitting, to the host system, information associated with the boot-up operation based at least in part on determining to boot-up the memory system in the first power mode.

In some examples, the threshold evaluation component 445 may be configured as or otherwise support a means for determining that a count of previous boot-up operation failures satisfies a threshold, where determining to boot-up the memory system further includes determining to boot-up the memory system in the second power mode that uses less current than the first power mode based at least in part on the count of previous boot-up operation failures satisfying the threshold.

In some examples, the previous boot-up evaluation component 450 may be configured as or otherwise support a means for determining that the previous boot-up operation failed based at least in part on a failure at a voltage detection component of the memory system configured to detect one or more voltage conditions received from a power management component, where determining to boot-up the memory system further includes determining to boot-up the memory system in the second power mode that uses less current than the first power mode based at least in part on determining that the previous boot-up operation failed based at least in part on the failure at the voltage detection component.

In some examples, the previous boot-up evaluation component 450 may be configured as or otherwise support a means for determining that an asynchronous power loss event occurred prior to the boot-up operation, where determining to boot-up the memory system further includes determining to boot-up the memory system in the second power mode based at least in part on determining that the asynchronous power loss event occurred prior to the boot-up operation.

In some examples, the previous boot-up evaluation component 450 may be configured as or otherwise support a means for determining that a previous power-down operation was initiated by the host system, where determining to boot-up the memory system further includes determining to boot-up the memory system in the second power mode based at least in part on determining that the previous power-down operation was initiated by the host system.

In some examples, the signal reception component 425 may be configured as or otherwise support a means for receiving, from the host system, a command to perform the boot-up operation in the second power mode, where receiving the signal from the host system to power-on the memory system includes the command. In some examples, the transmission component 440 may be configured as or otherwise support a means for transmitting, to the host system, information associated with the boot-up operation performed using the second power mode.

In some examples, the command from the host system includes a bInitPowerMode parameter indicating that the host system is configured to operate in a low power mode.

In some examples, the transmission component 440 may be configured as or otherwise support a means for transmitting, to the host system, information associated with the boot-up operation at the memory system, where the host system performs a second boot-operation after the memory system performs the boot-up operation on the memory system based at least in part on transmitting the information.

In some examples, the information associated with the boot-up operation at the memory system includes a power mode of the boot-up operation at the memory system.

Figure 5:
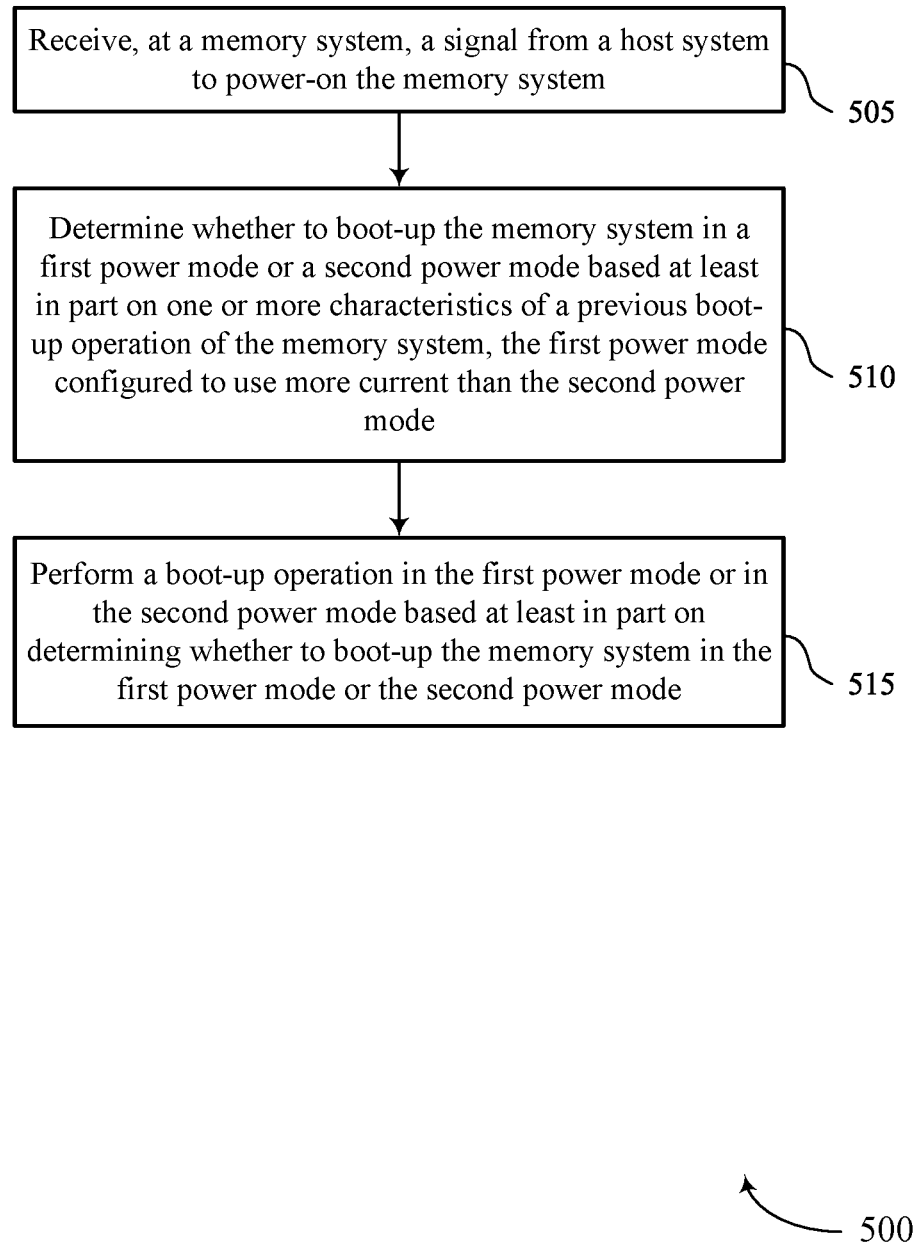
FIG. 5 shows a flowchart illustrating a method or methods that support power control for boot-up of memory systems in accordance with examples as disclosed herein.

FIG. 5 shows a flowchart illustrating a method 500 that supports power control for boot-up of memory systems in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 505, the method may include receiving, at a memory system, a signal from a host system to power-on the memory system. The operations of 505 may be performed in accordance with examples as disclosed herein. In some examples, aspects of the operations of 505 may be performed by a signal reception component 425 as described with reference to FIG. 4.

At 510, the method may include determining whether to boot-up the memory system in a first power mode or a second power mode based at least in part on one or more characteristics of a previous boot-up operation of the memory system, the first power mode configured to use more current than the second power mode. The operations of 510 may be performed in accordance with examples as disclosed herein. In some examples, aspects of the operations of 510 may be performed by a power mode determination component 430 as described with reference to FIG. 4.

At 515, the method may include performing a boot-up operation in the first power mode or in the second power mode based at least in part on determining whether to boot-up the memory system in the first power mode or the second power mode. The operations of 515 may be performed in accordance with examples as disclosed herein. In some examples, aspects of the operations of 515 may be performed by a boot-up operation component 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, a signal from a host system to power-on the memory system; determining whether to boot-up the memory system in a first power mode or a second power mode based at least in part on one or more characteristics of a previous boot-up operation of the memory system, the first power mode configured to use more current than the second power mode; and performing a boot-up operation in the first power mode or in the second power mode based at least in part on determining whether to boot-up the memory system in the first power mode or the second power mode.

Aspect 2: The method, apparatus, or non-transitory computer-readable medium of aspect 1, further including operations, features, circuitry, logic, means, or instructions, or any combination thereof for transmitting, to the host system, information associated with the boot-up operation based at least in part on determining to boot-up the memory system in the first power mode.

Aspect 3: The method, apparatus, or non-transitory computer-readable medium of any of aspects 1 through 2, further including operations, features, circuitry, logic, means, or instructions, or any combination thereof for determining that a count of previous boot-up operation failures satisfies a threshold, where determining to boot-up the memory system further includes determining to boot-up the memory system in the second power mode that uses less current than the first power mode based at least in part on the count of previous boot-up operation failures satisfying the threshold.

Aspect 4: The method, apparatus, or non-transitory computer-readable medium of any of aspects 1 through 3, further including operations, features, circuitry, logic, means, or instructions, or any combination thereof for determining that the previous boot-up operation failed based at least in part on a failure at a voltage detection component of the memory system configured to detect one or more voltage conditions received from a power management component, where determining to boot-up the memory system further includes determining to boot-up the memory system in the second power mode that uses less current than the first power mode based at least in part on determining that the previous boot-up operation failed based at least in part on the failure at the voltage detection component.

Aspect 5: The method, apparatus, or non-transitory computer-readable medium of any of aspects 1 through 4, further including operations, features, circuitry, logic, means, or instructions, or any combination thereof for determining that an asynchronous power loss event occurred prior to the boot-up operation, where determining to boot-up the memory system further includes determining to boot-up the memory system in the second power mode based at least in part on determining that the asynchronous power loss event occurred prior to the boot-up operation.

Aspect 6: The method, apparatus, or non-transitory computer-readable medium of any of aspects 1 through 5, further including operations, features, circuitry, logic, means, or instructions, or any combination thereof for determining that a previous power-down operation was initiated by the host system, where determining to boot-up the memory system further includes determining to boot-up the memory system in the second power mode based at least in part on determining that the previous power-down operation was initiated by the host system.

Aspect 7: The method, apparatus, or non-transitory computer-readable medium of any of aspects 1 through 6, further including operations, features, circuitry, logic, means, or instructions, or any combination thereof for receiving, from the host system, a command to perform the boot-up operation in the second power mode, where receiving the signal from the host system to power-on the memory system includes the command and transmitting, to the host system, information associated with the boot-up operation performed using the second power mode.

Aspect 8: The method, apparatus, or non-transitory computer-readable medium of aspect 7, further including operations, features, circuitry, logic, means, or instructions, or any combination thereof for the command from the host system includes a bInitPowerMode parameter indicating that the host system is configured to operate in a low power mode.

Aspect 9: The method, apparatus, or non-transitory computer-readable medium of any of aspects 1 through 8, further including operations, features, circuitry, logic, means, or instructions, or any combination thereof for transmitting, to the host system, information associated with the boot-up operation at the memory system, where the host system performs a second boot-operation after the memory system performs the boot-up operation on the memory system based at least in part on transmitting the information.

Aspect 10: The method, apparatus, or non-transitory computer-readable medium of aspect 9, further including operations, features, circuitry, logic, means, or instructions, or any combination thereof for the information associated with the boot-up operation at the memory system includes a power mode of the boot-up operation at the memory system.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a controller associated with a memory device, wherein the controller is configured to cause the apparatus to:
receive, at a memory system, a signal from a host system to power-on the memory system;
determine whether to boot-up the memory system in a first power mode or a second power mode based at least in part on one or more characteristics of a previous boot-up operation of the memory system, the first power mode configured to use more current than the second power mode; and
perform a boot-up operation in the first power mode or in the second power mode based at least in part on determining whether to boot-up the memory system in the first power mode or the second power mode.

2. The apparatus of claim 1, wherein the controller is further configured to cause the apparatus to:
transmit, to the host system, information associated with the boot-up operation based at least in part on determining to boot-up the memory system in the first power mode.

3. The apparatus of claim 1, wherein the controller is further configured to cause the apparatus to:
determine that a count of previous boot-up operation failures satisfies a threshold, wherein determining to boot-up the memory system further comprises determining to boot-up the memory system in the second power mode that uses less current than the first power mode based at least in part on the count of the previous boot-up operation failures satisfying the threshold.

4. The apparatus of claim 1, wherein the controller is further configured to cause the apparatus to:
determine that the previous boot-up operation failed based at least in part on a failure at a voltage detection component of the memory system configured to detect one or more voltage conditions received from a power management component, wherein determining to boot-up the memory system further comprises determining to boot-up the memory system in the second power mode that uses less current than the first power mode based at least in part on determining that the previous boot-up operation failed based at least in part on the failure at the voltage detection component.

5. The apparatus of claim 1, wherein the controller is further configured to cause the apparatus to:
determine that an asynchronous power loss event occurred prior to the boot-up operation, wherein determining to boot-up the memory system further comprises determining to boot-up the memory system in the second power mode based at least in part on determining that the asynchronous power loss event occurred prior to the boot-up operation.

6. The apparatus of claim 1, wherein the controller is further configured to cause the apparatus to:
determine that a previous power-down operation was initiated by the host system, wherein determining to boot-up the memory system further comprises determining to boot-up the memory system in the second power mode based at least in part on determining that the previous power-down operation was initiated by the host system.

7. The apparatus of claim 1, wherein the controller is further configured to cause the apparatus to:
receive, from the host system, a command to perform the boot-up operation in the second power mode, wherein receiving the signal from the host system to power-on the memory system comprises the command; and
transmit, to the host system, information associated with the boot-up operation performed using the second power mode.

8. The apparatus of claim 7, wherein:
the command from the host system comprises a bInitPowerMode parameter indicating that the host system is configured to operate in a low power mode.

9. The apparatus of claim 1, wherein the controller is further configured to cause the apparatus to:
transmit, to the host system, information associated with the boot-up operation at the memory system, wherein the host system performs a second boot-operation after the memory system performs the boot-up operation on the memory system based at least in part on transmitting the information.

10. The apparatus of claim 9, wherein the information associated with the boot-up operation at the memory system comprises a power mode of the boot-up operation at the memory system.

11. A method, comprising:
receiving, at a memory system, a signal from a host system to power-on the memory system;
determining whether to boot-up the memory system in a first power mode or a second power mode based at least in part on one or more characteristics of a previous boot-up operation of the memory system, the first power mode configured to use more current than the second power mode; and
performing a boot-up operation in the first power mode or in the second power mode based at least in part on determining whether to boot-up the memory system in the first power mode or the second power mode.

12. The method of claim 11, further comprising:
transmitting, to the host system, information associated with the boot-up operation based at least in part on determining to boot-up the memory system in the first power mode.

13. The method of claim 11, further comprising:
determining that a count of previous boot-up operation failures satisfies a threshold, wherein determining to boot-up the memory system further comprises determining to boot-up the memory system in the second power mode that uses less current than the first power mode based at least in part on the count of the previous boot-up operation failures satisfying the threshold.

14. The method of claim 11, further comprising:
determining that the previous boot-up operation failed based at least in part on a failure at a voltage detection component of the memory system configured to detect one or more voltage conditions received from a power management component, wherein determining to boot-up the memory system further comprises determining to boot-up the memory system in the second power mode that uses less current than the first power mode based at least in part on determining that the previous boot-up operation failed based at least in part on the failure at the voltage detection component.

15. The method of claim 11, further comprising:
determining that an asynchronous power loss event occurred prior to the boot-up operation, wherein determining to boot-up the memory system further comprises determining to boot-up the memory system in the second power mode based at least in part on determining that the asynchronous power loss event occurred prior to the boot-up operation.

16. The method of claim 11, further comprising:
determining that a previous power-down operation was initiated by the host system, wherein determining to boot-up the memory system further comprises determining to boot-up the memory system in the second power mode based at least in part on determining that the previous power-down operation was initiated by the host system.

17. The method of claim 11, further comprising:
receiving, from the host system, a command to perform the boot-up operation in the second power mode, wherein receiving the signal from the host system to power-on the memory system comprises the command; and
transmitting, to the host system, information associated with the boot-up operation performed using the second power mode.

18. The method of claim 17, wherein the command from the host system comprises a bInitPowerMode parameter indicating that the host system is configured to operate in a low power mode.

19. The method of claim 11, further comprising:
transmitting, to the host system, information associated with the boot-up operation at the memory system, wherein the host system performs a second boot-operation after the memory system performs the boot-up operation on the memory system based at least in part on transmitting the information.

20. The method of claim 19, wherein the information associated with the boot-up operation at the memory system comprises a power mode of the boot-up operation at the memory system.

21. A non-transitory computer-readable medium storing code, the code comprising instructions executable by a processor to:
receive, at a memory system, a signal from a host system to power-on the memory system;
determine whether to boot-up the memory system in a first power mode or a second power mode based at least in part on one or more characteristics of a previous boot-up operation of the memory system, the first power mode configured to use more current than the second power mode; and
perform a boot-up operation in the first power mode or in the second power mode based at least in part on determining whether to boot-up the memory system in the first power mode or the second power mode.

22. The non-transitory computer-readable medium of claim 21, wherein the instructions are further executable by the processor to:
transmit, to the host system, information associated with the boot-up operation based at least in part on determining to boot-up the memory system in the first power mode.

23. The non-transitory computer-readable medium of claim 21, wherein the instructions are further executable by the processor to:
determine that a count of previous boot-up operation failures satisfies a threshold, wherein determining to boot-up the memory system further comprises determining to boot-up the memory system in the second power mode that uses less current than the first power mode based at least in part on the count of previous boot-up operation failures satisfying the threshold.

24. The non-transitory computer-readable medium of claim 21, wherein the instructions are further executable by the processor to:
determine that the previous boot-up operation failed based at least in part on a failure at a voltage detection component of the memory system configured to detect one or more voltage conditions received from a power management component, wherein determining to boot-up the memory system further comprises determining to boot-up the memory system in the second power mode that uses less current than the first power mode based at least in part on determining that the previous boot-up operation failed based at least in part on the failure at the voltage detection component.

25. The non-transitory computer-readable medium of claim 21, wherein the instructions are further executable by the processor to:
determine that an asynchronous power loss event occurred prior to the boot-up operation, wherein determining to boot-up the memory system further comprises determining to boot-up the memory system in the second power mode based at least in part on determining that the asynchronous power loss event occurred prior to the boot-up operation.

* * * * *